(12) United States Patent
Wang et al.

(10) Patent No.: US 12,144,260 B2
(45) Date of Patent: Nov. 12, 2024

(54) WAFER-SCALE PIEZOELECTRIC BIO-ORGANIC THIN FILMS

(71) Applicant: Wisconsin Alumni Research Foundation, Madison, WI (US)

(72) Inventors: Xudong Wang, Middleton, WI (US); Fan Yang, Suzhou (CN); Jun Li, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 955 days.

(21) Appl. No.: 17/154,711

(22) Filed: Jan. 21, 2021

(65) Prior Publication Data

US 2022/0231218 A1 Jul. 21, 2022

(51) Int. Cl.
| | |
|---|---|
| H10N 30/00 | (2023.01) |
| C08J 5/18 | (2006.01) |
| C08J 7/06 | (2006.01) |
| C09D 1/00 | (2006.01) |
| H10N 30/02 | (2023.01) |
| H10N 30/87 | (2023.01) |

(52) U.S. Cl.
CPC ............. *H10N 30/704* (2024.05); *C08J 5/18* (2013.01); *C08J 7/06* (2013.01); *C09D 1/00* (2013.01); *H10N 30/02* (2023.02); *H10N 30/872* (2023.02); *C08J 2331/04* (2013.01); *C08J 2371/00* (2013.01)

(58) Field of Classification Search
CPC .. H10N 30/1051; H10N 30/02; H10N 30/872; H10N 30/857; H10N 30/098; C08J 5/18; C08J 7/06; C08J 2331/04; C08J 2371/00; C09D 1/00
See application file for complete search history.

(56) References Cited

U.S. PATENT DOCUMENTS

| | | | | | |
|---|---|---|---|---|---|
| 5,665,343 | A | * | 9/1997 | Sohn | A61P 35/00 424/78.26 |
| 10,278,390 | B2 | * | 5/2019 | Rolfe | A01N 25/34 |
| 10,629,800 | B2 | * | 4/2020 | Gong | C08J 5/245 |
| 10,694,607 | B1 | * | 6/2020 | Xu | H05B 45/22 |
| 2008/0097606 | A1 | * | 4/2008 | Cragg | A61F 2/3872 623/14.12 |
| 2013/0256581 | A1 | * | 10/2013 | Miyoshi | H10N 30/1051 427/535 |
| 2014/0368083 | A1 | * | 12/2014 | Ohashi | C08L 77/04 29/25.35 |
| 2020/0098971 | A1 | * | 3/2020 | Tofail | G06N 10/00 |
| 2022/0176171 | A1 | * | 6/2022 | Nguyen | A61L 9/16 |

OTHER PUBLICATIONS

Hosseini et al. "Glycine-Chitosan-Based Flexible Biodegradable Piezoelectric Pressure Sensor", ACS Appl. Mater. Interfaces 2020, 12, 9008-9016.

* cited by examiner

*Primary Examiner* — Emily P Pham
(74) *Attorney, Agent, or Firm* — Boyle Fredrickson, S.C.

(57) ABSTRACT

A flexible piezoelectric thin film, and method of manufacture, has a polyvinyl alcohol (PVA)-glycine-PVA sandwich heterostructure. The thin film is manufactured by evaporating the solvent from a glycine-PVA mixture solution. The film automatically assembles into the PVA-glycine-PVA sandwich heterostructure as it is salted out. Strong hydrogen bonding between the oxygen atoms in glycine and hydroxyl groups on PVA chains are responsible for the nucleation and growth of the piezoelectric γ-glycine and alignment of the domain orientation.

16 Claims, 4 Drawing Sheets

WAFER-SCALE PIEZOELECTRIC BIO-ORGANIC THIN FILMS

STATEMENT REGARDING FEDERALLY SPONSORED RESEARCH OR DEVELOPMENT

This invention was made with government support under EB021336 and EB027857 awarded by the National Institutes of Health. The government has certain rights in the invention.

CROSS REFERENCE TO RELATED APPLICATION

--

BACKGROUND OF THE INVENTION

The present invention relates to biomaterials exhibiting piezoelectric properties by transforming mechanical energy into electrical polarization and, more particularly, to a piezoelectric thin film that takes the form of a sandwiched heterostructure of amino acid and polymer layers and its method of manufacture.

Piezoelectricity is an electric charge that accumulates in certain solid materials in response to an applied mechanical stress, facilitating the conversion of mechanical energy to electrical energy and vice vera. This material property is a relatively common phenomenon that can be found in many organic and inorganic materials.

Inorganic piezoelectric materials may be preferred to organic piezoelectric materials because they exhibit stronger piezoelectricity. Advancements in inorganic piezoelectric crystals and their associated processing techniques, property enhancements, and multifunctionality have led to inorganic piezoelectric materials playing a critical role in a broad range of electromechanical system applications, e.g., sensing, acoustics, imaging, actuation, and energy harvesting.

Medically implantable and mountable devices have become an emerging application for piezoelectric materials. These applications require flexibility, biocompatibility, and biodegradability. Unfortunately, inorganic piezoelectric materials are intrinsically rigid, brittle, challenging to process, and may contain toxic elements. Even synthetic piezoelectric polymers, such as polyvinylidene difluoride (PVDF), are not able to satisfy the requirements of flexibility and degradability for these medical applications.

SUMMARY OF THE INVENTION

Piezoelectric biomaterials, such as silk, collagen, amino acids, chitin, and cellulose, can naturally offer many biomimetic properties such as reliability, biocompatibility, and reproducibility and flexibility to the manufacture of inorganic piezoelectric materials. These materials are mostly biodegradable, and their production is considered environmentally sustainable. However, most of these biomaterials have weak macroscale piezoelectric responses and do not easily form uniform and scalable unidirectional polarized structures. Therefore, large-scale assembly and domain aligning capability has not been feasible.

Glycine, the simplest amino acid, has a high piezoelectric coefficient ($d_{33}$ up to 10 pC/N) and exceptional stability (in $\gamma$ form). Therefore, it is a promising biobased material for piezoelectric biomaterial manufacture. However, like many inorganic molecules, pure glycine tends to form fragile bulk crystals with a very high Young's modulus (20 GPa). Moreover, glycine requires an extremely high electric field (over GV/m) to align its domains making macroscopic piezoelectricity of the polycrystalline film a challenge. Therefore, piezoelectric glycine has been rarely exploited for biomedical device applications.

The present invention provides a self-assembly strategy for wafer-scale synthesis of sandwiched heterostructure piezoelectric glycine thin films. The present inventors have found that solutions of glycine and polyvinyl alcohol (PVA) will self-assemble in organized polar crystalline structures when precipitated in a liquid solution. The hydrogen bonding between hydroxyl groups of PVA and oxygen atoms of glycine molecules lead to the formation and self-alignment of $\gamma$-glycine crystals across the entire thin film. The resultant piezoelectric glycine thin films possess a PVA-glycine-PVA sandwiched heterostructure with desired flexibility, biocompatibility, and biodegradability.

Films with appropriate glycine-to-PVA ratios, for example, ranging between 1:1 and 2:1, exhibit desired piezoelectric responses with a $g_{33}$ of 157.5×10-3 Vm/N, which is comparable to commercial piezoelectric soft materials, such as PVDF.

In one embodiment of the present invention, a thin film of piezoelectric material comprises an upper layer of polymer molecules having exposed hydroxyl groups, a lower layer of polymer molecules having exposed hydroxyl groups, and a core layer of core molecules wherein the core molecules are configured to hydrogen bond with the exposed hydroxyl group of the polymer molecules of the upper and lower layers.

It is thus one feature of at least one embodiment of the present invention to produce a naturally occurring sandwiched heterostructure by mixing self-aligning amino acid molecules and polymer molecules in solution without the need for high electric field poling.

In one embodiment of the present invention, the core molecules are amino acid molecules. In one embodiment of the present invention, the core molecules are glycine molecules configured to hydrogen bond to the polymer molecules in $\gamma$ form.

It is thus one feature of at least one embodiment of the present invention to utilize the self-alignment of oxygen atoms of $\gamma$-glycine molecules with the polymer chain across the thin film to create an extremely stable bond.

In one embodiment of the present invention, the core molecules may have a piezoelectric coefficient of at least 5 pC/N.

It is thus one feature of at least one embodiment of the present invention to utilize the strong macroscopic piezoelectric properties of the amino acid (i.e., glycine) to produce a strong piezoelectric material.

In one embodiment of the present invention, the polymer molecules may be polyvinyl acid (PVA) molecules.

It is thus one feature of at least one embodiment of the present invention to utilize the hydroxyl group of PVA molecule chains to self-align the $\gamma$-glycine molecules across the flexible substrate.

In one embodiment of the present invention, the polymer molecules in solution may be dissolvable using the same solvent with the core molecules in solution.

It is thus one feature of at least one embodiment of the present invention to process the thin film in an aqueous media, at low cost, and with large scale reproducible results. The production of thin film sheets may be continuous with the assistance of roll-to-roll fabrication.

In one embodiment of the present invention, the polymer molecules may have a crystallinity that is less than 25%.

It is thus one feature of at least one embodiment of the present invention that the lower crystallinity can offer higher flexibility to the film, while films with higher crystallinity are more brittle and rigid.

In one embodiment of the present invention, the ratio of core molecules to polymer molecules may range from 0.5:1 to 5:1. In one embodiment of the present invention, the ratio of core molecules to polymer molecules may range from 1:1 to 2:1.

It is thus one feature of at least one embodiment of the present invention to promote flexibility and stretchability of the substrate by using adequate amounts of polymer (i.e., PVA) while preventing crystal discontinuity and separation of the polymer layers when the glycine to PVA ratios is too high.

In one embodiment of the present invention, the film of piezoelectric material may be less than 50 micrometers. The film of piezoelectric material may be less than 40 micrometers.

It is thus one feature of at least one embodiment of the present invention to create a flexible film that is able to withstand high amounts of stress and strain within the human body without breakage.

In one embodiment of the present invention, the core layer may be at least 10 micrometers.

It is thus one feature of at least one embodiment of the present invention to promote the piezoelectric properties of glycine while keeping the film thin, flexible and stretchable.

In one embodiment of the present invention, a first and second electrode having a lower resistance than the first and second layer communicating with at least one of the first and second layer. A first wire may be connected to the first electrode and a second wire may be connected to the second electrode, where the first wire and second wire may deliver an electric charge from/to the thin film. An electronic circuit may be configured to consumer electrical power provided by the first and second electrodes.

It is thus one feature of at least one embodiment of the present invention to harvest an electrical potential produced by the piezoelectric thin film for use with implantable biomedical devices such as sensors and small electronics within the body. It is thus one feature of at least one embodiment of the present invention to produce a device that can be safely implanted within the human body without toxic effects and are biodegradable without being traceable after a certain amount of time.

In one embodiment of the present invention, a package surrounding the thin film constructed to fully dissolve in vivo in one year. The dissolvable package may be a film of polylactic acid (PLA). The dissolvable package may be further coated with dielectric oxide, such as aluminum oxide.

It is thus one feature of at least one embodiment of the present invention to create a useful lifespan of the piezoelectric material within the human body that permits electricity generation for a short amount of time but that dissolves after a certain period to minimize harmful effects to the body.

In one embodiment of the present invention, a method of manufacturing a thin film of piezoelectric material comprises mixing a solution of amino acid with a solution of polymer to form a homogenous mixture, precipitating the homogenous mixture within a container by heating the homogenous mixture until a solid precipitate is produced, and removing the solid precipitate from the container. The solid precipitate is a film having an upper layer of polymer molecules having an exposed hydroxyl group, a lower layer of polymer molecules having the exposed hydroxyl group, and a core layer of amino acid molecules wherein the amino acid hydrogen bonds with the exposed hydroxyl group of the polymer molecules of the upper and lower layers.

It is thus one feature of at least one embodiment of the present invention to produce large scale sheets of thin films with uniformity and reproducibility in manufacture.

These particular objects and advantages may apply to only some embodiments falling within the claims and thus do not define the scope of the invention.

DETAILED DESCRIPTION OF THE PREFERRED EMBODIMENT

Figure 1:
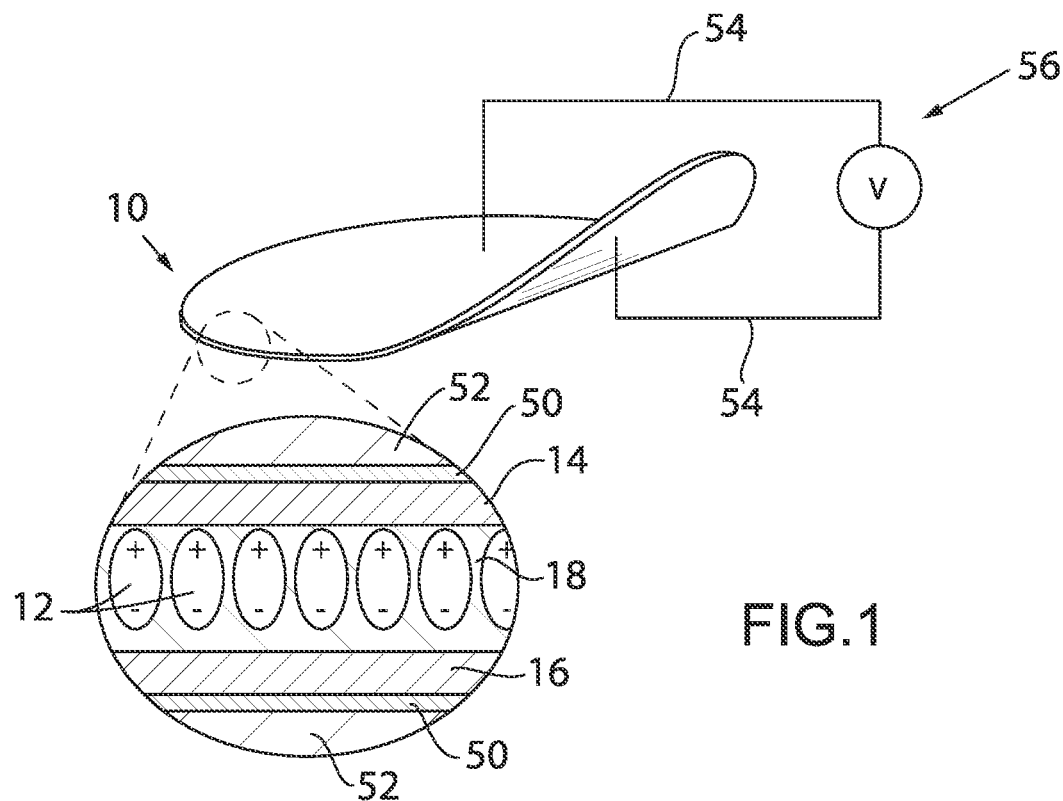
FIG. 1 is a schematic representation of one embodiment of the present invention showing a thin film of piezoelectric material having aligned γ-glycine crystals across the film and the thin film is further attached to two electrodes communicating with an electronic circuit to provide a voltage.

Referring initially to FIG. 1, a piezoelectric thin film 10 for use with the present invention is defined by an alignment of γ-glycine crystals 12 across the entire piezoelectric thin film 10 with the assistance of an interacting polymer matrix. The self-alignment of the γ-glycine crystals 12 during the fabrication process of the piezoelectric thin film 10, as further described below, results in a sandwiched heterostructure of outer layers 14, 16 of a polymer matrix and a core layer 18 of γ-glycine crystals 12 that provides a substantially uniform piezoelectric property.

Figure 2:
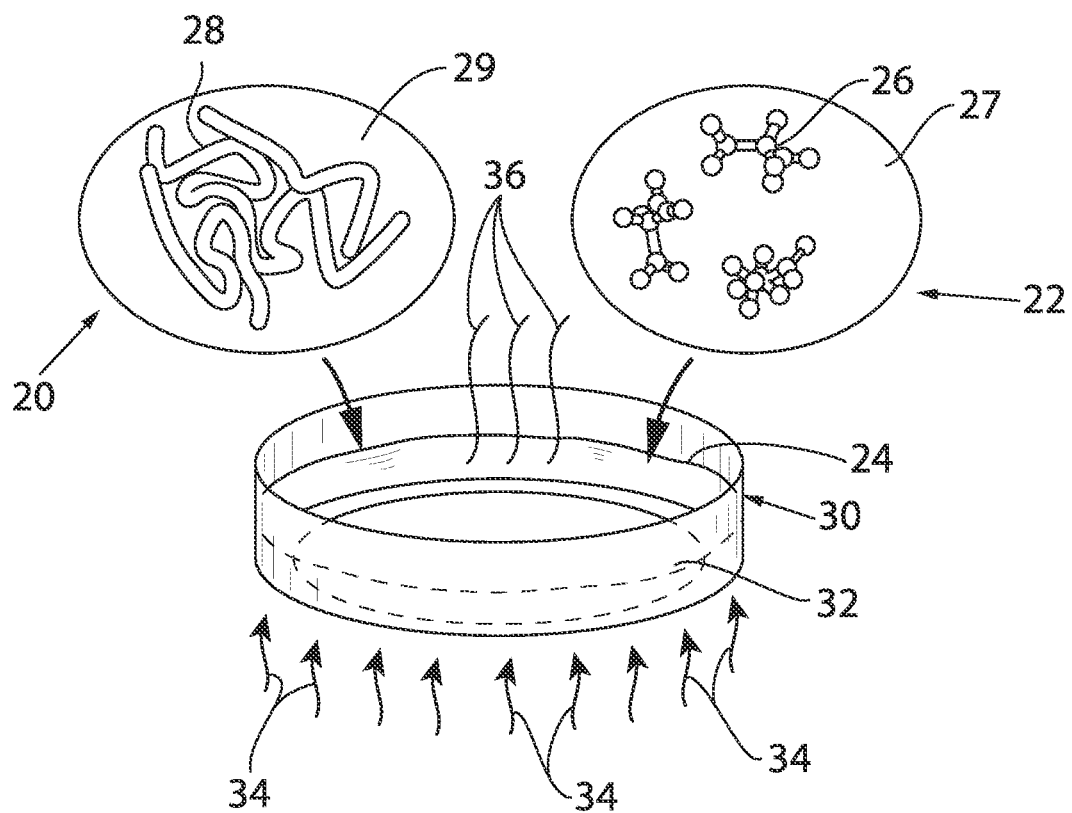
FIG. 2 is a schematic representation of one embodiment of the present invention showing a mixture solution of glycine and PLA on glass which is evaporated to form a uniform thin film.

Referring also to FIG. 2, the piezoelectric thin film 10 of the present invention is fabricated by mixing (a) a polymer solution 20 with (b) an amino acid solution 22. The polymer solution 20 is a homogenous solution composed of a soluble polymer mixed with water. The concentration of the polymer in the polymer solution 20 may be between 5-15% w/v and may be about 10% w/v. The amino acid solution 22 is a homogenous solution composed of a soluble amino acid mixed with water. The concentration of the amino acid in the polymer solution 20 may be between 5-15% w/v and may be about 10% w/v. It is understood that the concentrations of the polymer solution 20 and the amino acid solution 22 permit the polymer and amino acid solid to be dissolved within the water solvent. The concentrations of the polymer solution 20 and the amino acid solution 22 may be equal in order to make it easier to calculate desired ratios of the polymer and amino acid in a mixture solution, but it is understood that the concentrations of the polymer solution 20 and amino acid solution 22, respectively, may vary.

In a preferred embodiment of the present invention, the amino acid solution 22 may be composed of glycine powder 26 (amino acid solute) mixed with a solution of deionized water 27 (water solvent). Glycine 26 is the simplest amino acid with a chemical formula of $NH_2-CH_2-COOH$ and a low molecular weight of 75.07 g/mol. Glycine 26 has a density of 1.1607 g/cm$^3$. Glycine 26 has a strong macroscale piezoelectric response with a relatively high piezoelectric coefficient, the $d_{33}$ is at least 5 pC/n and at least 10 pC/N. Glycine 26 is also water soluble with a solubility of 24.99 g/100 mL (25 degrees Celsius).

The polymer solution 20 may be a water-soluble synthetic polymer. The polymer solution 20 may be composed of polyvinyl alcohol (PVA) powder 28 (polymer solute) mixed with a solution of deionized water 29 (water solvent). PVA 28 is a hydrophilic linear polymer with a long chain structure. PVA 28 has a chemical formula of $[CH_2CH(OH)]_n$. PVA 28 has a density of 1.19-1.31 g/cm$^3$. PVA 28 is an atactic material that is mostly amorphous with a certain level of crystallinity, for example, a degree of crystallinity of less than 25% and less than 20% and less than 15% and less than 10%. PVA 28 is highly water soluble and may have a solubility of less than 10 g/100 mL (25° C.). The solubility of PVA 28 in water is less than the solubility of PVA solution and glycine solution. The solubility of PVA 28 in glycine 26 is about 24.99 g/100 mL (25° C.).

The polymer solution 20 and the amino acid solution 22 are mixed and co-dissolvable to form a PVA-glycine composite solution 24. The PVA-glycine composite solution 24 may be obtained by stirring the mixture for at least one hour at a temperature of about 60 degrees Celsius.

The concentration of glycine 26 and PVA 28 within the PVA-glycine composite solution 24 control the ability of glycine 26 to create stable γ-glycine crystals and desired mechanical properties of the piezoelectric thin film 10. The PVA-glycine composite solution 24 may include glycine-to-PVA composition ratios ranging between 0.5:1 to 5:1 and desirably between 1:1 and 2:1, with exemplary ratios of 0.5:1, 1.5:1, 1:1, 2:1, and 3:1.

Following the formation of the PVA-glycine composite solution 24, the PVA-glycine composite solution 24 is cooled to room temperature before being casted into a mold 30 for forming the shape and thickness of the piezoelectric thin film 10. In one embodiment, the mold 30 may be a holding container such as a polystyrene Petri dish having a substantially flat support surface or bottom wall 32. It is understood that the mold 30 may take many varied shapes and forms including a cylinder, cuboid or three-dimensional shaped container with a circular, rectangular or polygonal shaped bottom wall 32, respectively.

The PVA-glycine composite solution 24 is poured into the mold 30 and, due to its low surface tension, dispersed evenly over the flat bottom wall 32 of the mold 30 in order to fully cover the flat bottom wall 32 of the mold 30. A size and thickness of the piezoelectric thin film 10 may be increased by increasing the amount of PVA-glycine composite solution 24 poured into the mold 30.

The uniform PVA-glycine composite solution 24 is dried within the mold 30, for example, for at last 24 to 48 hours, thus causing the γ-glycine crystals 12 to precipitate from the PVA-glycine composite solution 24. The PVA-glycine composite solution 24 is dried by heating 34 the mold 30 containing the PVA-glycine composite solution 24, for example, by placing the mold 30 into an oven at a temperature of about 60 degrees Celsius. As the solvent evaporates 36, the liquid film is crystallized at its edges and across its entire area. The crystallization process of the γ-glycine crystals 12 is described in further detail below.

After the PVA-glycine composite solution 24 is completely dried, the piezoelectric thin film 10 of γ-glycine crystals 12 is removed from the oven and allowed to cool at room temperature. The piezoelectric thin film 10 of γ-glycine crystals 12 may subsequently be peeled off the flat bottom wall 32 of the mold 30, for example, with the aid of tweezers. The resultant piezoelectric thin film 10 is a flexible piezoelectric composite structure that is separated from any other supports.

The thickness ratio between the core layer 18 and the outer layers 14, 16 corresponds with the composition ratio of the glycine-to-PVA in the PVA-glycine composite solution 24. The total thickness of the piezoelectric thin film 10 may be between 20 and 50 micrometers and less than 50 micrometers and less than 40 micrometers and approximately 30 micrometers. A thickness of the outer layers 14, 16 may be being between 5 to 10 micrometers and approximately 7 micrometers, respectively. The thickness of the outer layers 14, 16 may be approximately equal. A thickness of the core layer 18 may be between 10 and 20 micrometers and approximately 16 micrometers. The core layer 18 may have a thickness that is approximately twice or at least twice the thickness of the outer layers 14, 16, respectively. The piezoelectric thin film 10 may have a volume of at least 1 mm$^3$ and a surface area of at least 1 cm$^2$ and at least 10 cm$^2$ and at least 50 cm$^2$.

Figure 3:
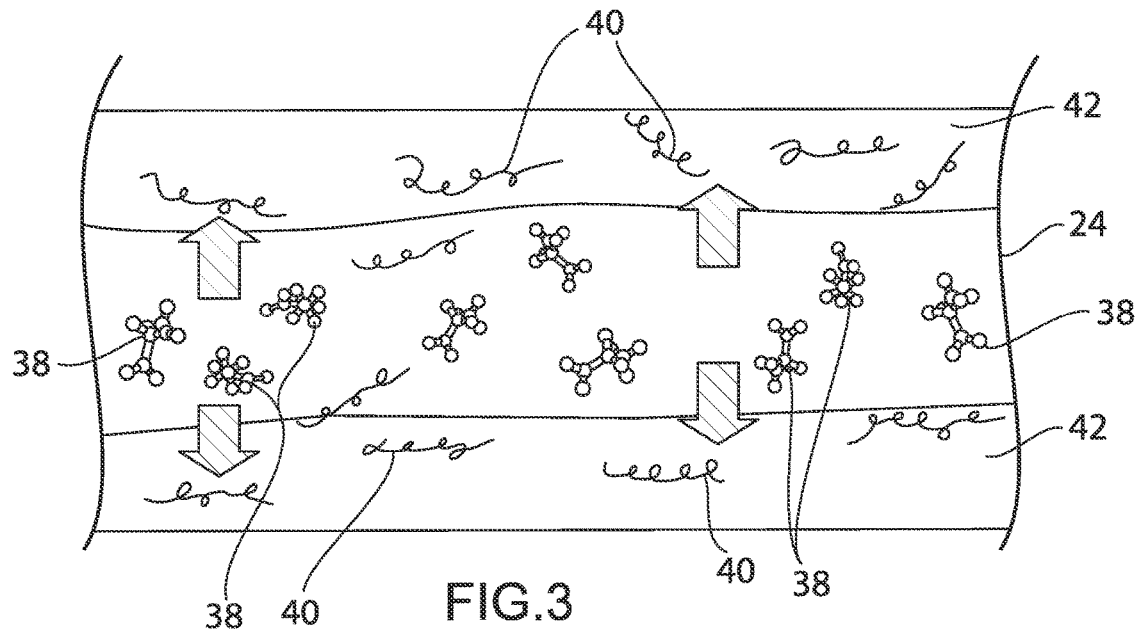
FIG. 3 is a schematic representation of the salting out effect of PVA on the layers of PVA-glycine-PVA solution.
Figure 4:
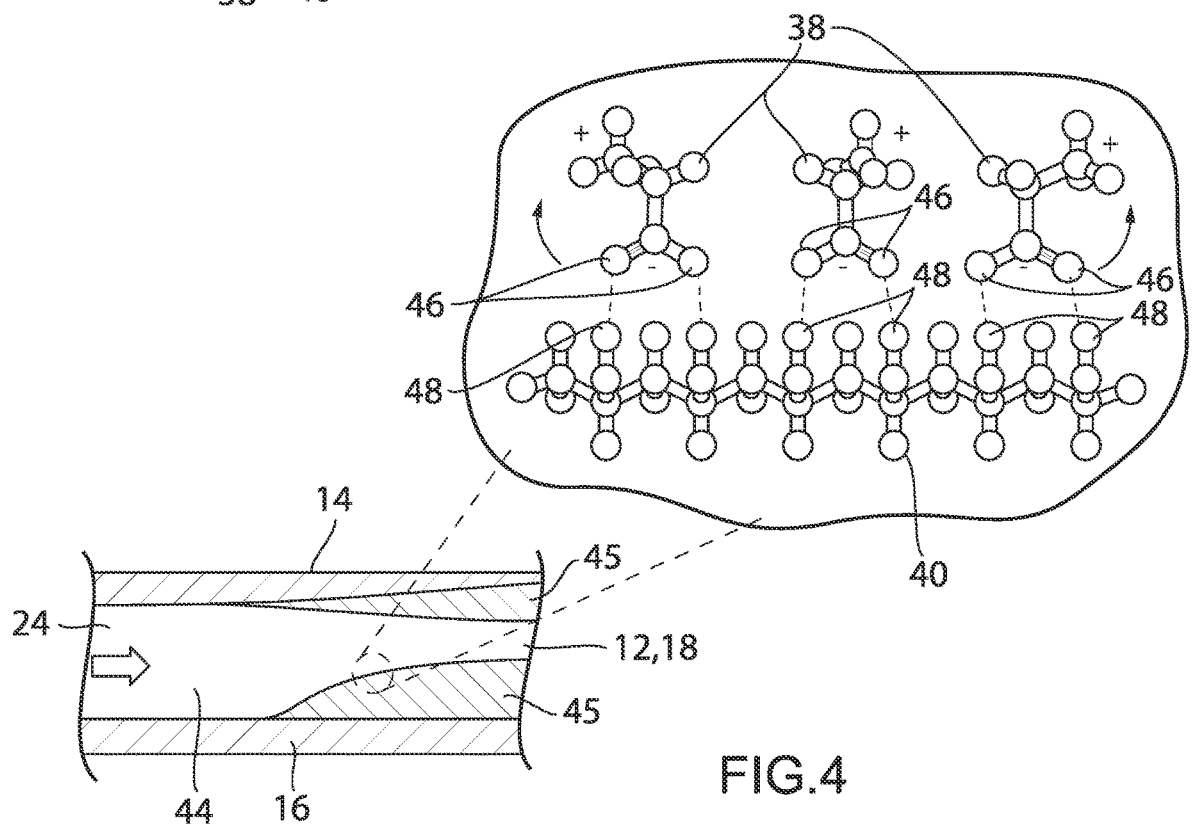
FIG. 4 is a schematic representation of the glycine crystal growth at the PVA-glycine interface and the orientation of the alignment of γ-glycine molecules at the PVA interface during crystal growth, leading to long-range polarization alignment.

Referring to FIGS. 3 and 4, the process of direct solidification of the PVA-glycine composite solution 24 assists with the precipitation of the γ-glycine crystals 12 from the PVA-glycine composite solution 24. As further discussed below, the molecular structure of PVA molecules 40 assists with the self-alignment of the γ-glycine crystals 12.

PVA molecules 40 are highly soluble in water since the comprise a large amount of hydroxyl groups which interact with water molecules through hydrogen bonds. The PVA molecules 40 have both hydrophilic (i.e., water loving, polar) functional and lipophilic (i.e., fat-loving) functional groups that initially causes the PVA molecules 40 to form thin and concentrated PVA layers at the upper and lower surfaces of the PVA-glycine composite solution 24 as the PVA-glycine composite solution 24 is heated. PVA has a density that is slightly higher than water causing the PVA layer to form at the lower surface. However, the surface tension of water and the less dense amorphous feature of the PVA layer causes the PVA layer at the upper surface to form as well.

As the water solvent 42 is evaporated from the PVA-glycine composite solution 24, the concentration of glycine molecules 38 and PVA molecules 40, respectively, increases in the PVA-glycine composite solution 24. A "salting out" effect occurs due to the competition of water hydration between the glycine molecules 38 and the PVA molecules 40. Since glycine molecules 38 have a higher water affinity than the PVA molecules 40, the PVA molecules are "salted out" from the water solvent 42. The PVA molecules 40 are precipitated out of the PVA-glycine composite solution 24, leaving a glycine rich liquid layer 44 sandwiched between the outer layers 14, 16 of concentrated PVA molecules 40.

Referring now to FIG. 4, further evaporation of the water solvent 42 causes the PVA-glycine composite solution 24 to supersaturate causing the glycine molecules 38 to crystalize around the outer edges of the glycine rich liquid layer 44. The concentrated glycine rich liquid layer 44 that is confined in between the outer layers 14, 16 of PVA molecules 40 is eventually completely precipitated, as indicated by interface zones 45, as water is removed from the PVA-glycine composite solution 24 thus forming the sandwiched heterostructure of the PVA-glycine-PVA sandwiched piezoelectric thin film 10. The upper layer of PVA molecules continues to be supported by the glycine rich liquid layer 44 as water is drawn out of the layer.

The precipitation of the glycine crystals 12 from the PVA-glycine composite solution 24 is facilitated by the interaction of glycine molecules 38 with the chain of PVA molecules 40 as it crystalizes in the interface zones 45. Glycine has two functional groups, a negatively charged carboxyl group (COOH) and a positively charged amine group ($NH_2$) resulting in a net charge of zero. The carboxyl group (COOH) of glycine provides two oxygen (O) atoms 46 that hydrogen bond with the hydroxyl (—OH) group 48 of the chain of PVA molecules 40. The exposure of the —OH groups 48 on the chain of PVA molecules 40 naturally guides the glycine molecules 38 to align its O atoms 46 to bond with the —OH groups 48. The dipoles of the PVA molecules 40 thus naturally align with the chain of PVA molecules 40 thus producing self-alignment of γ-glycine across the entire film.

Glycine can be crystallized in three polymorphic phases (α, β, and γ) under ambient conditions. γ-Glycine and β-glycine are known to have piezoelectric properties due to their non-centrosymmetric polar structure, and the α-phase has a centrosymmetric structure without piezoelectricity. The alignment condition of the glycine molecules 38 with the chain of the PVA molecules 40 show that when two exposed O atoms 46 of the glycine molecules 38 bond with exposed —OH groups 48 on the chain of PVA molecules 40, the glycine is bound to the PVA in the γ phase alignment. The γ phase alignment produces the lowest binding energy (−0.9655 eV) compared to the alternative alignment conditions associated with α phase (−0.3359 eV) and β phase alignment (−0.4083 eV). Without the presence of the exposed —OH groups 48 on the chain of PVA molecules 40, the dipole direction in the glycine molecules 38 would exhibit an alternating distribution minimizing the internal electrostatic energy, and the α phase of glycine would dominate.

The hydrogen bonding of the exposed O atoms 46 of the glycine molecules 38 with the exposed —OH groups 48 of the PVA molecules 40 at the interfaces of the concentrated liquid layer 44 of glycine rich solution and the outer layers 14, 16 of PVA molecules 40 leads to the growth of γ-glycine crystals 12 across the film to produce the piezoelectric thin film 10 having a sandwiched heterostructure of the core layer 18 of self-aligned γ-glycine crystals 12 sandwiched between uniform PVA outer layers 14, 16 above and below the core layer 18.

Referring again to FIG. 1, the piezoelectricity of the piezoelectric thin film 10 may be harvested by attaching the piezoelectric thin film 10 to a pair of electrodes 50 with a lower resistance than the outer layers 14, 16 of the piezoelectric thin film 10 that can transmit a voltage difference between the outer layers 14, 16 of the piezoelectric thin film 10. The outer layers 14, 16 of the piezoelectric thin film 10 may be sandwiched between the pair of electrodes 50. In one embodiment, the pair of electrodes 50 may be molybdenum (Mo) thin films deposited on the outer layers 14, 16 of the piezoelectric thin film 10 using, for example, by sputter deposition or atomic layer deposition. The thickness of the electrodes 50 may be approximately 100 nm. It is understood that other conductive, biocompatible biomaterials may be used as the pair of electrodes 50 such as molybdenum, magnesium, iron, zinc and tungsten.

It is understood that other configurations of the electrodes may be used with the piezoelectric thin film 10 which transmit a voltage difference between the outer layers 14, 16, or convert electric signals by generating periodically distributed mechanical forces via the piezoelectric thin film 10. For example, in an alternative embodiment, a pair of interdigitated electrodes may be attached to one side or one outer layer 14, 16 of the piezoelectric thin film 10 in an interlocking finger-like periodic pattern of parallel in-plane electrodes.

The pair of electrodes 50 may be further attached to electrical wire conductors 54, respectively, that can communicate the electrical charge through the wire conductors 54. The electrical wire conductors 54 may be insulated conducting wires, for example, copper wires insulated with polydimethylsiloxane (PDMS) to prevent charge from flowing to the surrounding tissue being dissipated in surrounding tissue or exposing the tissue to chemical reactions. The electrical wire conductors 54 may be further connected to an electronic circuit 56 communicating with the wire conductors to consume electrical power provided by the pair of electrodes 50 and measure a voltage between the outer layers 14, 16 of the piezoelectric thin film 10.

The γ-glycine crystals 12 and PVA molecules 40 of the piezoelectric thin film 10 are soluble in water and therefore the piezoelectric thin film 10 may dissolve in an aqueous solution, such as when the piezoelectric thin film 10 is submerged in bodily fluids.

The device lifetime within the human body may be controlled using a device package 52 that fully dissolves over time, for example, within one year or within 6 months or within 3 months or within 1 month. In one embodiment, the piezoelectric thin film 10 may be contained within a device package 52 that comprises an outer layer of a polymer material such as polylactic acid (PLA). The polymer material may be further coated with dielectric oxide, such as aluminum oxide to provide an additional dielectric and water barrier.

The thickness of the device package 52 will determine the lifetime of the piezoelectric thin film 10. The film of PLA may be between 10 to 50 micrometers thick and about 30 micrometers thick. The aluminum oxide coating may be between 40 to 60 nanometers thick and about 50 nanometers thick. It is understood that the piezoelectric thin film 10, the electrodes 50, and the device package 52 are biodegradable thus leaving little to no trace within the body.

The biomaterial elements of the piezoelectric thin film 10 and the encapsulating device package 52 ensures the biocompatibility of the device. The biodegradation and bioresorption of the piezoelectric thin film 10 and device package 52 allow the device to be safely used when implanted within the human body.

The applications of the piezoelectric thin film 10 with or implanted within the human body may be as described in the following applications: U.S. application Ser. No. 16/009, 553, entitled "Self-Powered, Auto-Responsive Implanted Vagal Nerve Stimulator for Weight Control"; U.S. application Ser. No. 16/376,178, entitled "Electric Bandage for Accelerated Wound Recovery"; U.S. application Ser. No. 16/851,400, entitled "3D Printed and In-Situ Poled Flexible Piezoelectric Pressure Sensor" and U.S. application 63/093,860, entitled "Biodegradable Transient Battery Built on Core-Double-Shell Zinc Microparticle Networks," whereby each is assigned to the present applicant and each of which is hereby incorporated by reference.

Example 1: Synthesis of Glycine-PVA Sandwiched Films and Device Fabrication

PVA in water solution (10% w/v) was prepared by dissolving 10 g PVA (Mw 13000-23000, Sigma Aldrich) in 100 ml deionized water. In order to obtain a homogeneous solution, the mixture was stirred for 3 h at 80° C.

Glycine solution was obtained by dissolving 10 g glycine (DOT Scientific, Inc.) in 100 ml deionized water (10% w/v).

10 ml of 10% glycine solution was added into 10 ml of 10% PVA solution to obtain a glycine-PVA solution with glycine-to-PVA ratio of 1:1. With the same manner, other different glycine-to-PVA ratios, 0.5:1, 1.5:1, 2:1, and 3:1, of the solution were obtained by adding 10 ml 5%, 15%, 20%, and 30% prepared glycine solution into 10 ml prepared 10% PVA solution, respectively. A homogeneous solution of PVA and glycine was obtained by constantly stirring the mixture for 1 h at 60° C. using magnetic rotator. The solution was covered in order to avoid the formation of a glassy solid layer at the air-solution interface during the preparation process. The as-prepared mixture solution was then directly used for film growth.

At room temperature, the mixture solution was slowly applied to a petri dish. Low surface tension quickly spread the liquid into a thin and flat film covering the bottom of the petri dish. Continuously adding the mixture solution increased the liquid film coverage until it fully covered the bottom surface, and then increased the thickness of the liquid film. The liquid film coverage and thickness were used to control the glycine-PVA films size and thickness, respectively.

The petri dish with the liquid film (without cover) was then placed in a convection oven at 60° C. until the film was completely dried. The dish with crystalized film was then removed from the oven and set to cool down to room temperature in atmosphere. The glycine-PVA films were directly peeled off by tweezers for characterization and device fabrication.

Mo thin films with a thickness of 200 nm were deposited on both sides of the glycine-PVA film as electrodes by using Leica ACE600 sputter coater. The Mo-deposited film was packaged by flexible polylactic acid (PLA) films (50 µm thickness) with another Al2O3 (50 nm) coating (ClearBags, Inc.) to enhance the encapsulation property (water barrier).

Example 2: Mechanical Properties of Glycine-PVA Films

Figure 5:
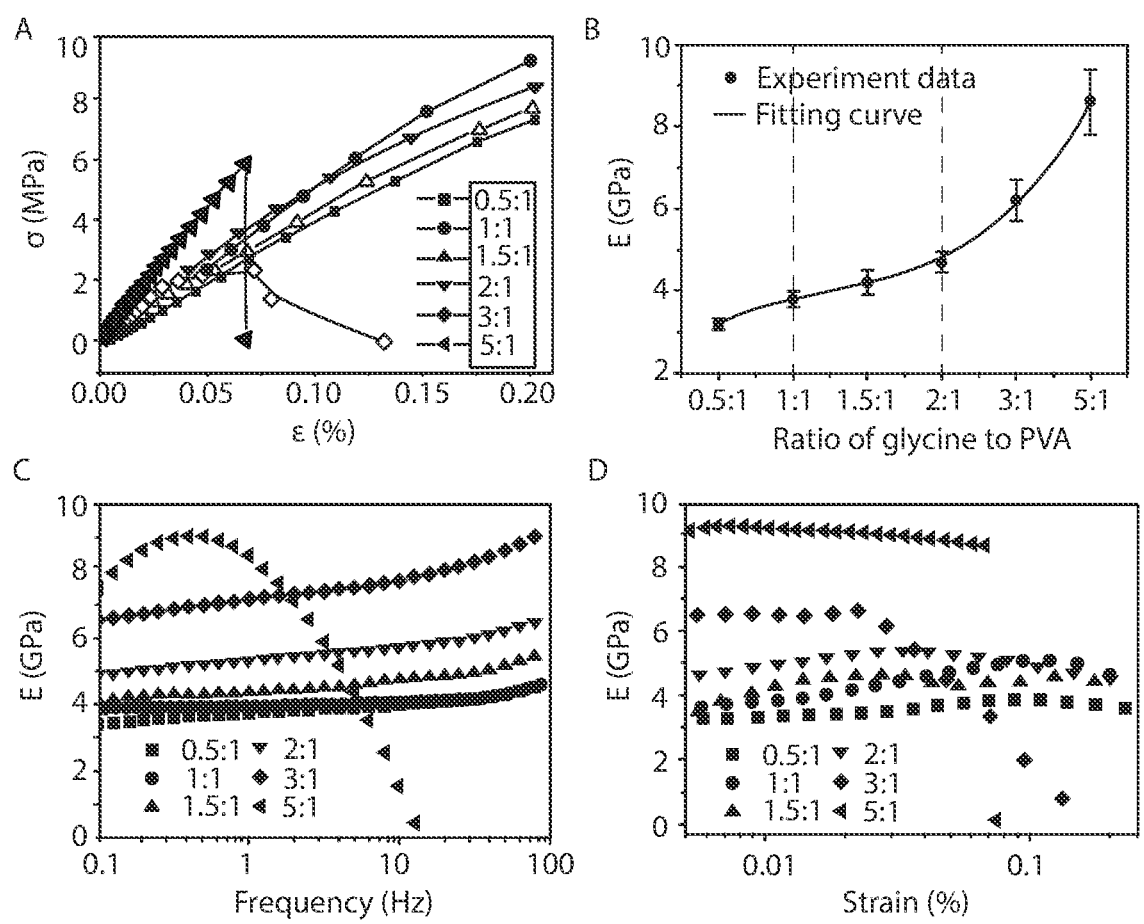
FIG. 5 are graphical representations of (A) Stress-strain curves of prepared films with different composition ratios; (B) Elastic moduli of the glycine-PVA films calculated from the stress-strain curves in (A) with the defined region representing the optimal film composition that offered both low moduli and appreciable piezoelectric performance; (C) Dynamic mechanical analysis of glycine-PVA films in the frequency sweep mode from 0.1 to 100 Hz at a constant strain of 0.1%; (D) Dynamic mechanical analysis of as-prepared glycine-PVA films in the strain sweep mode from 0.005% to 0.2% strain at a constant frequency of 1 Hz.

Referring to FIG. 5, the piezoelectric thin film 10 exhibits desirable mechanical properties of high uniformity, integrity and flexibility. The soft and continuous PVA encapsulation outer layers 14, 16 effectively dissipates the mechanical impacts on the fragile γ-glycine crystals 12 while the compact and uniform glycine crystal packing largely minimized the weak or defective spots in the piezoelectric thin film 10.

As shown by the stress-strain curves in FIG. 5A, thin films 10 with higher PVA content (glycine-to-PVA ratio≤2:1) exhibited significantly enhanced stretchability with tensile strains greater than 0.2%, while films with glycine-to-PVA ratio at or over 3:1 rapidly fractured at tensile strains less than 0.07%.

Referring to FIG. 5B, thin films 10 with a glycine-to-PVA ratio less than 2:1, the elastic moduli all remained at a moderate level of ~4 GPa, which was nearly an order of magnitude smaller than pure glycine crystals (~30 GPa). As the ratio rose over 2:1, the modulus jumped substantially and reached 9 GPa at 5:1 ratio. Therefore, the range of ratios between 1:1 and 2:1, as shown in the defined area, provided desirably stable elastic moduli with the stretchability limits of FIG. 5A.

Referring to FIG. 5C, flexibility remained consistently low under repeating 0.1% strain at frequencies lower than 10 Hz for thin films 10 with a glycine-to-PVA ratio≤3:1. This frequency range covers the frequency range of most biomechanical movements (0.5-5 Hz). The elastic moduli slightly increased as frequency rose higher than 10 Hz due to the relatively slow recovery leading to a more elastic response. Only the highest glycine-content piezoelectric thin film 10 (ratio of 5:1) exhibited a rapid breakdown at 1 Hz.

Referring to FIG. 5D, thin films 10 with glycine-to-PVA ratio lower than 3:1 had a stable elastic performance even with strain up to 0.2%.

Example 3: Piezoelectric Property of Glycine-PVA Films

Figure 6:
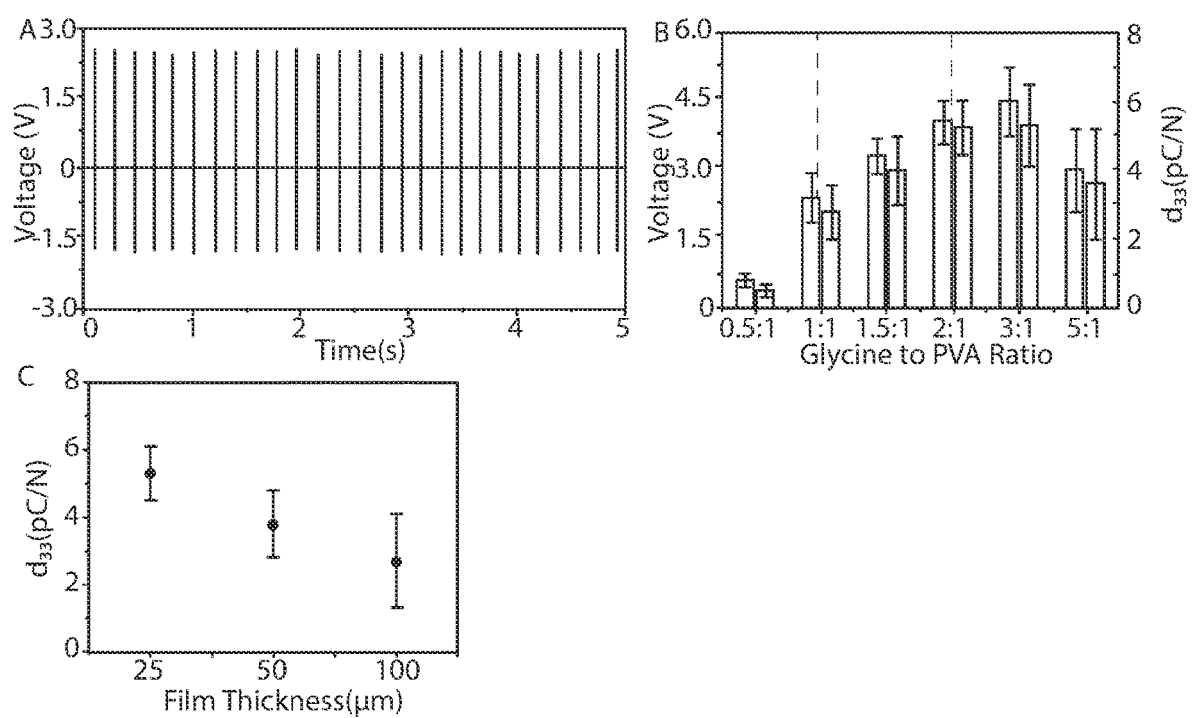
FIG. 6 are graphical representations of (A) Piezoelectric voltage output of glycine-PVA films at 2:1 ratio measured under 30 N impulse force; (B) Piezoelectric voltage out and $d_{33}$ coefficients measured of glycine-PVA films with different composition ratios; (C) $d_{33}$ coefficients of glycine-PVA films at 2:1 ratio with different thickness.

Referring to FIG. 6, piezoelectric performance of the glycine-PVA thin films 10 was evaluated by measuring the electric output under impulse forces. A 60 mm² molybdenum (Mo) layer (100 nm) was deposited on each side of the films as the electrodes. A 30 N impulse force was repeatedly applied to the film surface over an area of 25 mm² at a frequency of 3 Hz.

FIG. 6A shows a stable piezoelectric voltage output from a 30 µm-thick, 2:1 ratio glycine-PVA film. FIG. 6B shows films with other glycine-to-PVA ratios also exhibited appreciable piezoelectric outputs (V).

Referring to FIG. 6B, the bulk-scale piezoelectric property was further quantified by a $d_{33}$ meter on films with different glycine-to-PVA ratios (30 µm in thickness). The highest $d_{33}$ (6 pC/N) was observed from the film with 3:1 ratio, which was closely followed by the 2:1 film with a $d_{33}$ of ~5.3 pC/N. This value is superior to most reported bio-organic films such as silk (1.5 pC/N), collagen (2.6 pC/N), chitin (4 pC/N), and cellulose (1.3 pC/N).

The initial rise of $d_{33}$ following the increased glycine ratio could be attributed to the increased amount of γ-glycine in the film. Further increase of glycine ratio beyond 3:1 ratio reduced both voltage output and $d_{33}$. Although glycine retained a majority of the γ phase at higher concentrations, the crystal discontinuity and separation from the PVA encapsulating layers were not favorable for the γ-glycine domain alignment.

The same phenomenon could be found from thicker films, which exhibited reduced $d_{33}$ due to the loss of sandwiched structure (FIG. 6C). Nevertheless, once the γ-glycine was well confined by the PVA layers, its piezoelectric performance was stable.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties.

To aid the Patent Office and any readers of any patent issued on this application in interpreting the claims appended hereto, applicants wish to note that they do not intend any of the appended claims or claim elements to invoke 35 U.S.C. 112(f) unless the words "means for" or "step for" are explicitly used in the particular claim.

What we claim is:

1. A thin film of piezoelectric material comprising:
a first layer of polymer molecules having exposed hydroxyl groups on its monomers;
a second layer of polymer molecules having exposed hydroxyl groups on its monomers; and
a core layer of a piezoelectric material sandwiched between the first and second layers and having core molecules configured to bond with the exposed hydroxyl groups of the polymer molecules of the first and second layers to align the piezoelectric material for enhanced piezoelectric effect.

2. The thin film of piezoelectric material of claim 1 wherein the core molecules are amino acid molecules.

3. The thin film of piezoelectric material of claim 2 wherein the core molecules are glycine molecules and the glycine molecules are configured to bond to the polymer molecules in γ form.

4. The thin film of piezoelectric material of claim 3 wherein the glycine molecules have a piezoelectric coefficient of at least 5 pC/N.

5. The thin film of piezoelectric material of claim 1 wherein the polymer molecules are polyvinyl acid (PVA) molecules.

6. The thin film of piezoelectric material of claim 1 wherein the polymer molecules have a crystallinity that is less than 25%.

7. The thin film of piezoelectric material of claim 1 wherein the polymer molecules in solution are dissolvable using a same solvent with the core molecules in solution.

8. The thin film of piezoelectric material of claim 1 wherein the core layer is operative to align through hydrogen bonding with the first and second layer.

9. The thin film of piezoelectric material of claim 1 wherein the thin film of piezoelectric material has a thickness of less than 40 micrometers.

10. The thin film of piezoelectric material of claim 1 wherein a thickness of the core layer is at least 10 micrometers.

11. The thin film of piezoelectric material of claim 1 further comprising first and second electrodes having a lower resistance than the first and second layers and communicating with at least one of the first and second layer.

12. The thin film of piezoelectric material of claim 11 further comprising a first wire connected to the first electrode and a second wire connected to the second electrode, wherein the first wire and second wire deliver an electric charge from the thin film.

13. The thin film of piezoelectric material of claim 12 further comprising an electronic circuit configured to consume electrical power provided by the first and second electrodes.

14. The thin film of piezoelectric material of claim 13 further comprising a package surrounding the thin film constructed to fully dissolve in vivo in one year.

15. The thin film of piezoelectric material of claim 14 wherein the package is a film of polylactic acid (PLA).

16. The thin film of piezoelectric material of claim 15 wherein the package is further coated with aluminum oxide.

* * * * *